(12) United States Patent
Luan et al.

(10) Patent No.: US 9,577,120 B2
(45) Date of Patent: *Feb. 21, 2017

(54) ANTI-REFLECTIVE COATING WITH HIGH OPTICAL ABSORPTION LAYER FOR BACKSIDE CONTACT SOLAR CELLS

(71) Applicant: SunPower Corporation, San Jose, CA (US)

(72) Inventors: Hsin-Chiao Luan, Palo Alto, CA (US); Denis De Ceuster, Woodside, CA (US)

(73) Assignee: SunPower Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/271,122

(22) Filed: May 6, 2014

(65) Prior Publication Data

US 2014/0373910 A1 Dec. 25, 2014

Related U.S. Application Data

(63) Continuation of application No. 13/470,576, filed on May 14, 2012, now Pat. No. 8,748,736, which is a
(Continued)

(51) Int. Cl.
*H01L 31/00* (2006.01)
*H01L 31/0216* (2014.01)
(Continued)

(52) U.S. Cl.
CPC ... *H01L 31/02168* (2013.01); *H01L 31/02167* (2013.01); *H01L 31/02363* (2013.01);
(Continued)

(58) Field of Classification Search
CPC .............. H01L 31/02167; H01L 31/02168; H01L 31/02165; H01L 31/022441; H01L 31/02366; H01L 31/041; H01L 31/02363; Y02E 10/50; Y02E 10/546; Y02E 10/547
(Continued)

(56) References Cited

U.S. PATENT DOCUMENTS 5,377,045 A * 12/1994 Wolfe ............... C03C 17/36
359/360
6,093,757 A * 7/2000 Pern ............... B32B 17/10678
136/251
(Continued)

FOREIGN PATENT DOCUMENTS

CN 1144573 A 3/1997
CN 1448983 A 10/2003

*Primary Examiner* — Lindsey Bernier
(74) *Attorney, Agent, or Firm* — Okamoto & Benedicto LLP

(57) ABSTRACT

A multilayer anti-reflection structure for a backside contact solar cell. The anti-reflection structure may be formed on a front side of the backside contact solar cell. The anti-reflection structure may include a passivation level, a high optical absorption layer over the passivation level, and a low optical absorption layer over the high optical absorption layer. The passivation level may include silicon dioxide thermally grown on a textured surface of the solar cell substrate, which may be an N-type silicon substrate. The high optical absorption layer may be configured to block at least 10% of UV radiation coming into the substrate. The high optical absorption layer may comprise high-k silicon nitride and the low optical absorption layer may comprise low-k silicon nitride.

5 Claims, 12 Drawing Sheets

Related U.S. Application Data continuation of application No. 12/325,878, filed on Dec. 1, 2008, now Pat. No. 8,198,528.

(60) Provisional application No. 61/007,758, filed on Dec. 14, 2007.

(51) Int. Cl.
*H01L 31/0236* (2006.01)
*H01L 31/068* (2012.01)
*H01L 31/0224* (2006.01)

(52) U.S. Cl.
CPC .......... *H01L 31/02366* (2013.01); *H01L 31/022441* (2013.01); *H01L 31/0682* (2013.01); *Y02E 10/50* (2013.01); *Y02E 10/546* (2013.01); *Y02E 10/547* (2013.01)

(58) Field of Classification Search
USPC ................................ 136/252, 256, 257, 261
See application file for complete search history.

(56) References Cited

U.S. PATENT DOCUMENTS

| | | | |
|---|---|---|---|
| 8,198,528 B2* | 6/2012 | Luan | H01L 31/02366 136/256 |
| 2006/0196535 A1* | 9/2006 | Swanson | H01L 31/02167 136/244 |

* cited by examiner

| Materials | Wavelength of Light | k | α (1/cm) | Thickness Required to reduce light intensity to 1/Exp(1) (64%) | Thickness Required to Reduce Intensity by 10% |
|---|---|---|---|---|---|
| a-Si | 350nm | 2.904 | 1.0E+06 | 10nm | 1nm |
| | 400nm | 0.303 | 9.5E+04 | 105nm | 11nm |
| | 535nm | 0.030 | 7.0E+03 | 1432nm | 151nm |
| | 600nm | 0.020 | 4.2E+03 | 2387nm | 251nm |
| SiN | 350nm | 0.004345 | 1.56E+03 | 6410nm | 675nm |
| | 400nm | 0.002178 | 6.82E+02 | 14669nm | 1545nm |
| | 535nm | 0.000691 | 1.61E+02 | 62188nm | 6544nm |
| | 600nm | 0.000452 | 9.47E+01 | 105634nm | 11126nm |

FIG. 7

| Materials | Wavelength of Light | k | α (1/cm) | Thickness Required to reduce light intensity to 1/e (64%) | Thickness Required to Reduce Intensity by 10% |
|---|---|---|---|---|---|
| Low k SiN | 350nm | 1.18E-02 | 4.2E+03 | 2360nm | 249nm |
| | 400nm | 7.67E-03 | 2.4E+03 | 4150nm | 437nm |
| | 535nm | 0.004 | 9.3E+02 | 10697nm | 1127nm |
| | 600nm | 0.003 | 6.8E+02 | 14601nm | 1538nm |
| High k SiN | 350nm | 0.4645 | 1.67E+05 | 59nm | 6nm |
| | 400nm | 0.2761 | 8.67E+04 | 95nm | 10nm |
| | 535nm | 0.0067 | 1.57E+03 | 6354nm | 668nm |
| | 600nm | 0.0029 | 6.07E+02 | 16464nm | 1735nm |

FIG. 12

ANTI-REFLECTIVE COATING WITH HIGH OPTICAL ABSORPTION LAYER FOR BACKSIDE CONTACT SOLAR CELLS

CROSS-REFERENCE TO RELATED APPLICATION

This application is a continuation of U.S. application Ser. No. 13/470,576, filed on May 14, 2012, which is a continuation of U.S. Pat. No. 8,198,528, which claims the benefit of U.S. Provisional Application No. 61/007,758, filed on Dec. 14, 2007. The aforementioned disclosures are incorporated herein by reference in their entirety.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor substrate using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Backside contact solar cells, in general, are known in the art. Examples of backside contact solar cells are disclosed in U.S. Pat. Nos. 5,053,083 and 4,927,770, which are both incorporated herein by reference in their entirety. FIG. 1 schematically shows another example of a conventional backside contact solar cell.

In the example of FIG. 1, a conventional backside contact solar cell 100 includes an N-type silicon substrate 102. The front side of the solar cell 100 is generally labeled as 120 and the backside, which is opposite the front side, is generally labeled as 121. The front side of the solar cell faces the sun during normal operation to collect solar radiation. The front side is randomly textured to reduce reflection and thereby increase the amount of solar radiation collected in the substrate 102. A multilayer anti-reflection structure 110 comprising a thermally grown silicon dioxide ($SiO_2$) layer 122 and a silicon nitride layer 103 is formed on the textured silicon surface.

The backside of the solar cell 100 includes P-type diffusion regions 105 and N-type diffusion regions 106. The diffusion regions 105 and 106 may be formed by diffusion of appropriate dopants from the backside. Metal fingers 109 electrically connect to the P-type diffusion regions 105, while metal fingers 110 electrically connect to the N-type diffusion regions 106. The metal fingers 109 and 110 allow electrons generated in the solar cell 100 to be utilized by external electrical circuits. Layers 107 provide isolation to prevent electrical shorts.

The performance of a backside contact solar cell improves as the interface state density between $SiO_2$ and Si is reduced. The interface between the silicon dioxide layer 122 and the surface of the substrate 102 is thus designed to reduce their interface state density. Silicon nitride layer 103 may also further reduce the effect of the $SiO_2$/Si interface states on the performance of the solar cell 100. The process of reducing the $SiO_2$/Si interface state density and their effect on solar cell performance is also referred to as "passivation."

Embodiments of the present invention help prevent degradation of front side passivation of a backside contact solar cell.

SUMMARY

In one embodiment, an anti-reflection structure for a backside contact solar cell is formed on a front side of the solar cell. The anti-reflection structure may include a passivation level, a high optical absorption layer over the passivation level, and a low optical absorption layer over the high optical absorption layer. The passivation level may include silicon dioxide thermally grown on a textured surface of the solar cell substrate, which may be an N-type silicon substrate. The high optical absorption layer may be configured to block at least 10% of UV radiation coming into the substrate. The high optical absorption layer may comprise high-k silicon nitride and the low optical absorption layer may comprise low-k silicon nitride.

These and other features of the present invention will be readily apparent to persons of ordinary skill in the art upon reading the entirety of this disclosure, which includes the accompanying drawings and claims.

DESCRIPTION OF THE DRAWINGS

FIG. 7 shows a table of optical properties and the effect of amorphous silicon and silicon nitride on light intensity.

FIG. 12 shows a table of optical properties and the effect of low-k and high-k silicon nitrides on light intensity.

DETAILED DESCRIPTION

In the present disclosure, numerous specific details are provided, such as examples of materials, process parameters, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Without being limited by theory, the inventor believes that currently available backside contact solar cells may be improved based on the following analysis.

The passivation of the front side textured surface is important for making high-efficiency backside contact solar cells because the density of electrons and holes generated from collected solar radiation is concentrated at the front surface of the silicon substrate. The light intensity and the density of photo-generated electrons and holes in the silicon substrate drop exponentially from the front surface to the backside surface of the substrate. Without good passivation on the front side, large amounts of electrons and holes can recombine at the SiO2/Si interface and result in reduced solar cell efficiency.

Figure 2:
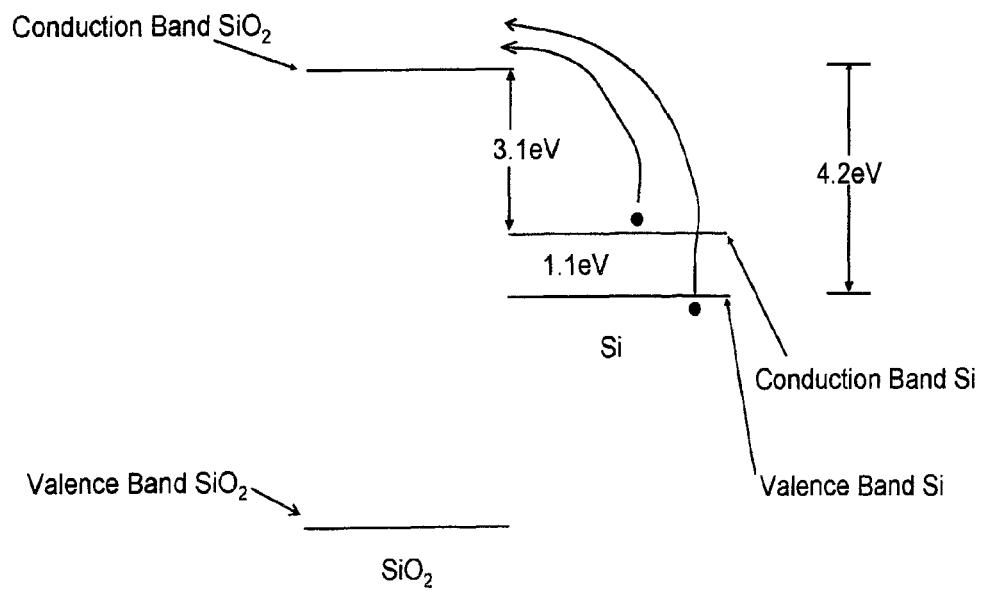
FIG. 2, which shows a band diagram of a front side of a conventional backside contact solar cell, illustrates the mechanism responsible for the degradation of front side passivation.

UV radiation can degrade the front side passivation of backside contact solar cells, reducing efficiency and creating reliability problems. FIG. 2, which shows a band diagram of the front side of a conventional backside contact solar cell, illustrates the mechanism responsible for the degradation of front side passivation. The energy difference between the conduction band of silicon dioxide and that of silicon is 3.1 eV. This energy corresponds to the energy of a photon with wavelength of 400 nm. UV radiation with wavelength shorter than 400 nm would have enough energy to excite electrons from the silicon conduction band to the silicon dioxide conduction band, increasing the SiO2/Si defect state density. This process thus leads to increased recombination of electrons and holes at the front surface and reduces solar cell efficiency. See also, P. E. Gruenbaum, R. R. King, R. M. Swanson, "Photoinjected hot-electron damage in silicon point-contact solar cells," Journal of Applied Physics, vol. 66, p. 6110-6114, 1989.

Figure 3:
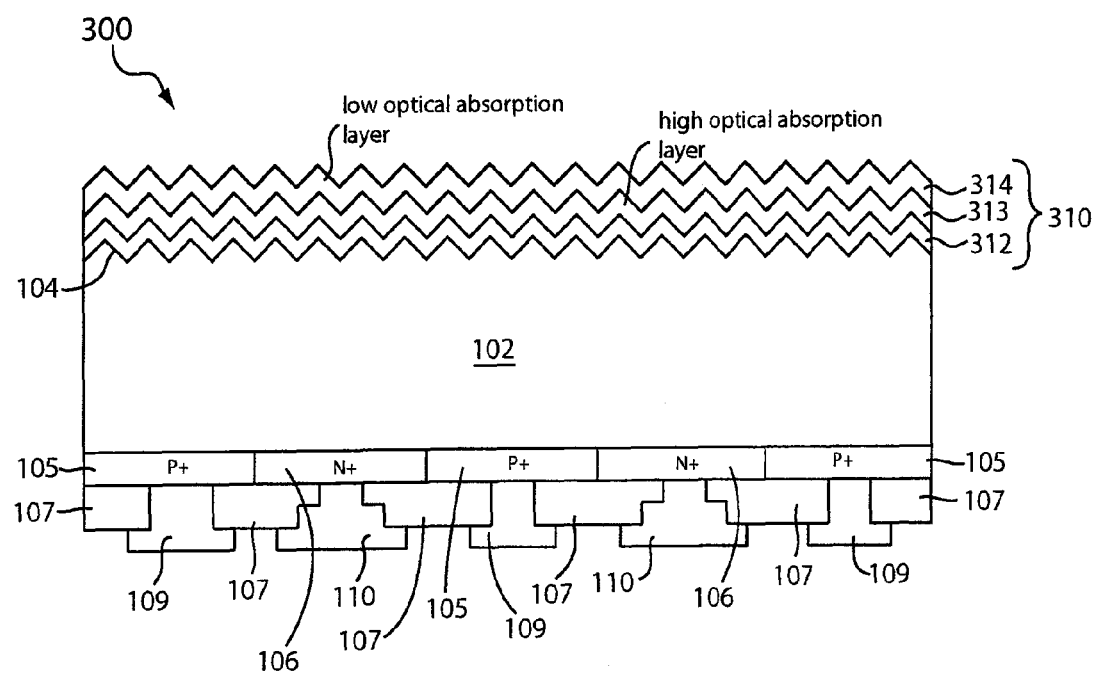
FIG. 3 schematically shows a backside contact solar cell in accordance with an embodiment of the present invention.

FIG. 3 schematically shows a backside contact solar cell 300 in accordance with an embodiment of the present invention. The solar cell 300 is the same as the solar cell 100 of FIG. 1 except for the use of anti-reflection structure 310 rather than 110. Components common to both solar cells 100 and 300 have been previously described with reference to FIG. 1.

In one embodiment, the anti-reflection structure 310 comprises a passivation layer 312, a high optical absorption layer 313 formed over the passivation layer 312, and a low optical absorption layer 314 formed over the high optical absorption layer 313. In one embodiment, the passivation layer 312 comprises silicon dioxide thermally grown to a thickness of about 0.5 nm to 100 nm, while the low optical absorption layer 314 comprises silicon nitride deposited to a thickness of about 5 nm to 100 nm by plasma enhanced chemical vapor deposition or reactive sputtering.

The high optical absorption layer 313 is so named because, relative to the low optical absorption layer 314, it absorbs a significant percentage of light passing through it. In one embodiment, the high optical absorption layer 313 is configured to block at least 10% of light having a wavelength of 400 nm or shorter. In general, the use of a high optical absorption layer on a front side of a solar cell is not recommended in most solar cell designs, and is thus not common practice in the solar cell industry, because a high optical absorption layer can reduce the amount of light reaching the solar cell substrate. In other words, a high optical absorption layer can adversely affect solar cell efficiency. This is the reason why low optical absorption layers are generally preferred to be used on the front side of solar cells. However, as will be more apparent below, the use of a high optical absorption layer on the front side has unexpected benefits when used with a backside contact solar cell in that the high optical absorption layer can improve solar cell stability without detrimentally affecting efficiency. In fact, studies performed by the inventor show that a high optical absorption layer on the front side of a backside contact solar cell can actually help increase efficiency in some cases.

To improve UV stability and achieve minimal performance degradation over time, the high optical absorption layer 313 is configured to reduce the amount of UV radiation attacking the SiO2/Si interface (generally labeled as "104") of the solar cell 300 with minimal filtering effect on visible light. For example, the high optical absorption layer 313 may comprise a material that is relatively transparent to visible light but highly absorbing to UV radiation (i.e., light with a wavelength in the range of 400 nm and shorter). The high optical absorption layer 313 decreases UV radiation damage on the interface between a silicon dioxide passivation layer 312 and the silicon substrate 102, which comprises N-type silicon in one embodiment.

Figure 4:
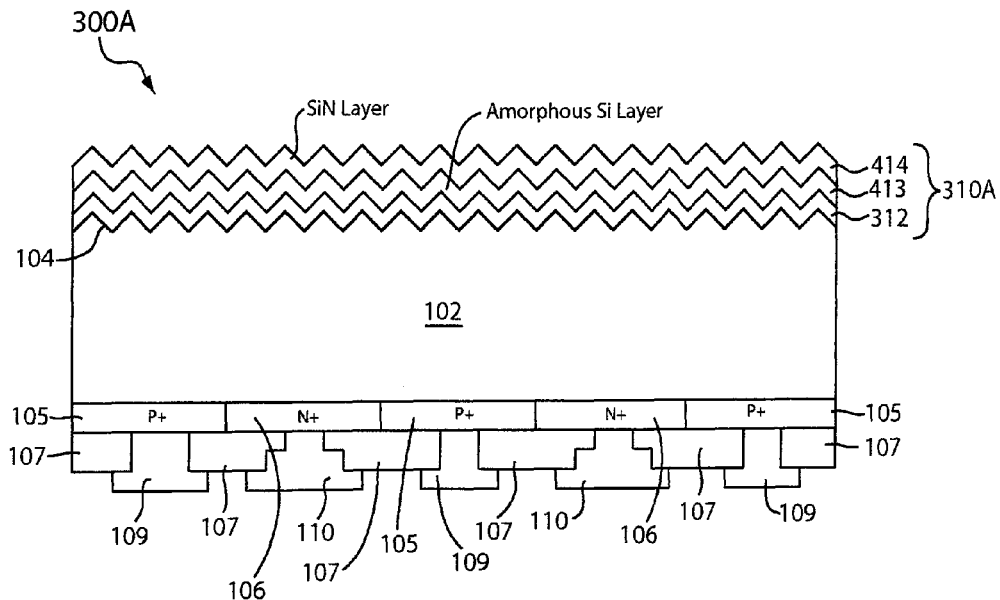
FIG. 4 schematically shows a backside contact solar cell in accordance with an embodiment of the present invention.

FIG. 4 schematically shows a backside contact solar cell 300A in accordance with an embodiment of the present invention. The solar cell 300A is a particular embodiment of the solar cell 300 (see FIG. 3) where the high optical absorption layer comprises an amorphous silicon layer 413 and the low optical absorption layer comprises a silicon nitride layer 414. The multi-layer anti-reflection structure of the solar cell 300A is collectively labeled as "310A." The solar cells 300A and 300 are otherwise the same.

Figure 5:
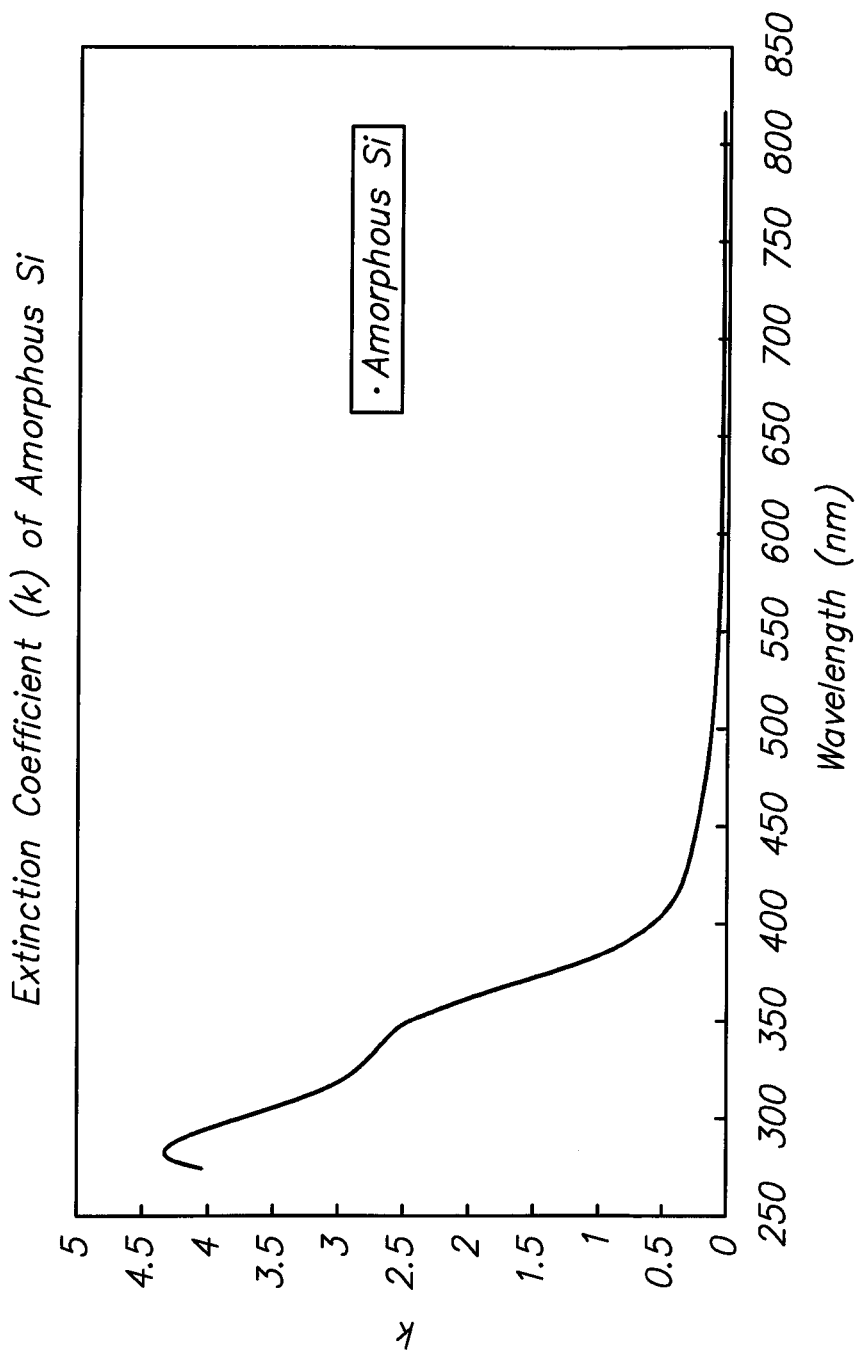
FIG. 5 shows a plot of the extinction coefficient (k) of amorphous silicon as a function of wavelength of light.
Figure 6:
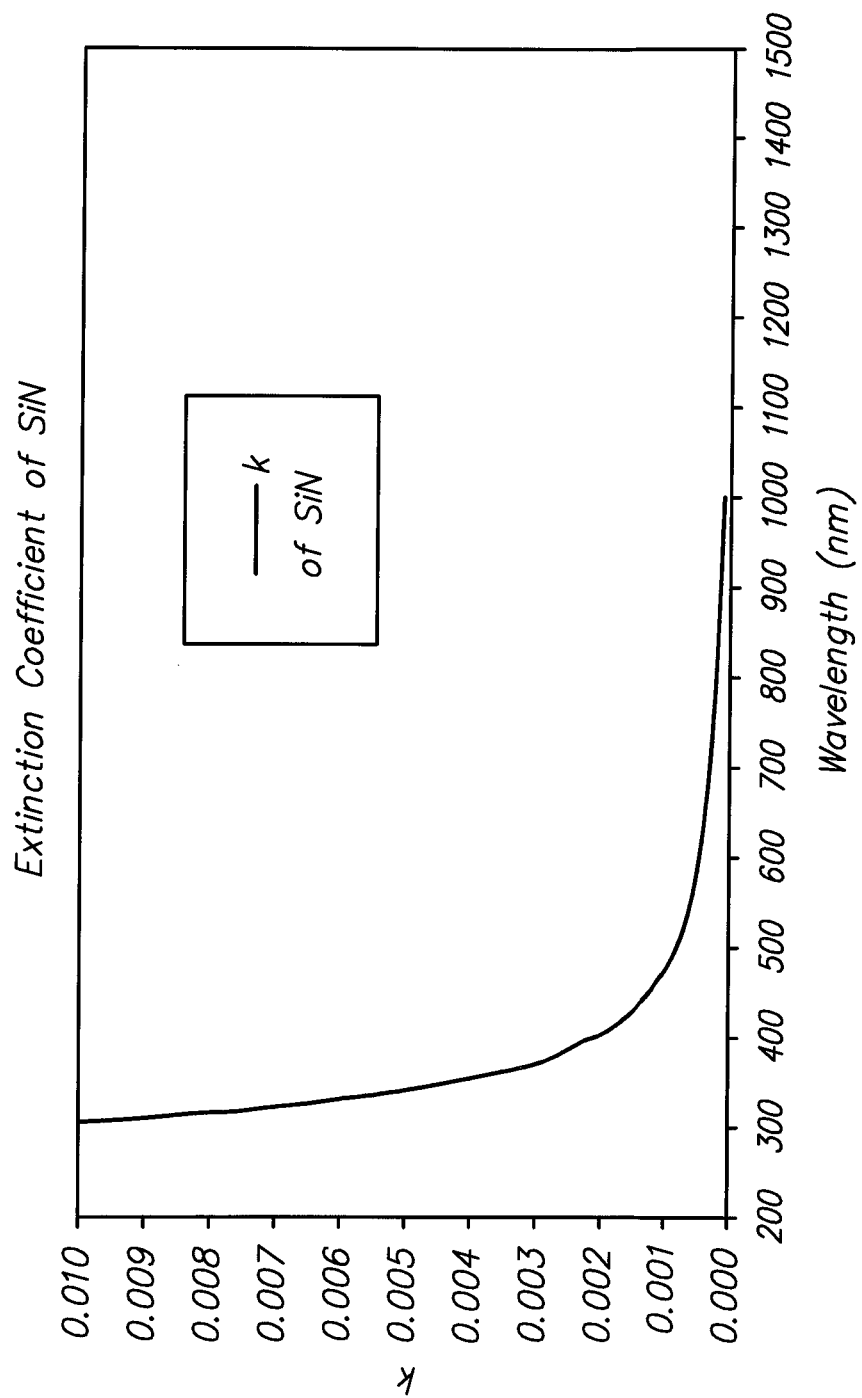
FIG. 6 shows a plot of the extinction coefficient (k) of silicon nitride as a function of wavelength of light.

FIGS. 5 and 6 show plots of the extinction coefficient (k) of amorphous silicon and silicon nitride, respectively, as a function of wavelength of light. In the context of solar cells, extinction coefficient is a measure of how well a material absorbs light. The intensity of light reaching the $SiO_2$/Si interface 104 of the backside contact solar cell 300A when amorphous silicon or silicon nitride is used in the anti-reflective coating 310A can thus be evaluated using the extinction coefficients of the two materials.

FIG. 7 shows a table of optical properties and the effect of amorphous silicon and silicon nitride on light intensity. The table of FIG. 7 has entries for wavelength of light, extinction coefficient (k), calculated absorption coefficient (α), the thickness required in each material for light intensity to drop by 64% (this is 1/e), and the thickness required for light intensity to drop by 10% for amorphous silicon (a-Si) and silicon nitride.

Because of its larger extinction and absorption coefficients, the thickness of amorphous silicon required for light to loose significant intensity is relatively thin compared to that of silicon nitride. Considering light with a wavelength of 400 nm, which is the longest wavelength in the UV spectrum that can significantly damage the $SiO_2$/Si interface, it takes about 11 nm of amorphous silicon to filter out 10% of the light. With a wavelength of 350 nm, it takes only about 1 nm of amorphous silicon to filter out 10% of the light. These thicknesses are markedly different compared to those for silicon nitride. At 400 nm, it takes about 1545 nm of silicon nitride to filter out 10% of the light. In a typical anti-reflection structure in solar cells, the thickness of silicon nitride is usually less than one tenth of this value. UV radiation, which has a wavelength shorter than 400 nm, would thus pass through silicon nitride essentially with no filtering. When more than 11 nm of amorphous silicon is formed between silicon nitride and silicon dioxide in a multilayer anti-reflection structure, as in the anti-reflection structure 310A, less than 90% of the UV radiation would pass through the amorphous silicon. Amorphous silicon, therefore, can be employed as an excellent UV filter for protecting the SiO2/Si interface of a backside contact solar cell. When employed as a high optical absorption layer in a multi-layer anti-reflection structure of a backside contact cell, amorphous silicon is preferably formed to filter out or block at least 25% of solar radiation coming in from the front side of the solar cell.

Figure 8:
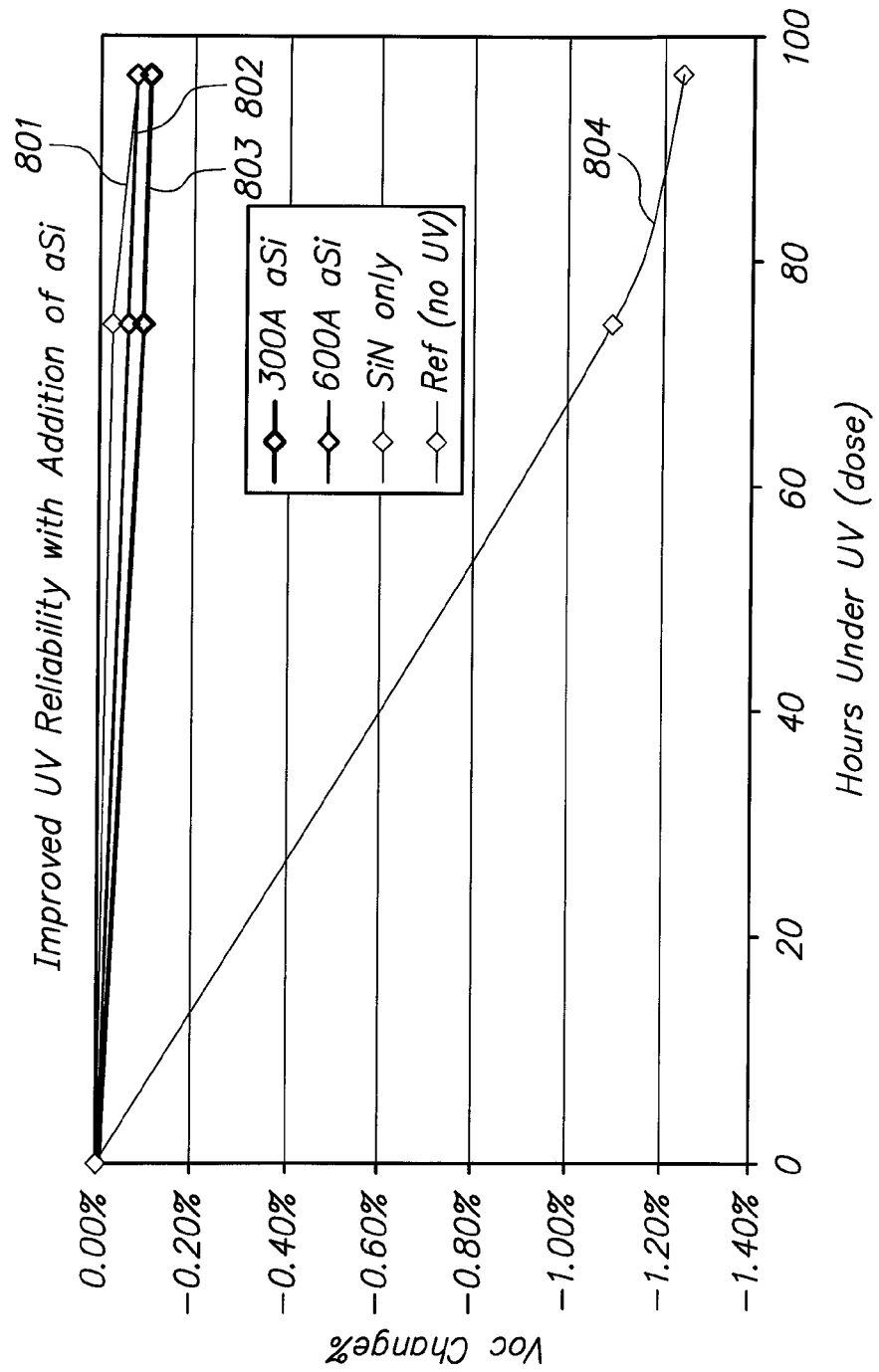
FIG. 8 shows plots illustrating improvement in UV stability when amorphous silicon is used in a multilayer anti-reflection structure of a backside contact solar cell.

FIG. 8 shows plots illustrating improvement in UV stability when amorphous silicon is used in a multilayer anti-reflection structure of a backside contact solar cell, such as in the solar cell 300A of FIG. 4. The plots of FIG. 8 are from experiments involving backside contact solar cells. In FIG. 8, the vertical axis represents percent change in open circuit voltage (Voc) of the backside contact solar cells involved in the experiment, while the horizontal axis represents the amount of time in hours the solar cells were under UV radiation. The plot 801 is for reference only, and shows percent change in open circuit voltage over time when the solar cell is not exposed to any UV radiation. The plot 802 is for a backside contact solar cell as in the solar cell 300A with a 100 nm thick silicon nitride layer 414 and 60 nm thick amorphous silicon layer 413, and the plot 803 is for a backside contact solar cell as in the solar cell 300A with a 100 nm thick silicon nitride layer 414 and 30 nm thick amorphous silicon layer 413. The plot 804 is for a backside contact solar cell as in the solar cell 100 (see FIG. 1). That is, the plot 804 is for a conventional backside contact solar cell without an amorphous silicon layer on its anti-reflection structure.

As is evident from FIG. 8, in the case where only silicon nitride is used in the anti-reflection structure (plot 804), the open circuit voltage of the solar cell has degraded more than 1.2% after 80 hours of exposure to UV radiation. When 30 nm (greater than 11 nm) of amorphous silicon is added to the anti-reflection structure (plot 803), the solar cell becomes robust against UV damage. With a 30 nm thick amorphous silicon, the open circuit voltage of the solar cell dropped to less than 0.1% over the same 80 hour period. When 60 nm of amorphous silicon is used, the open circuit voltage showed even less degradation (plot 802), having a profile similar to that of the solar cell not exposed to UV radiation (plot 801). Addition of amorphous silicon to the anti-reflection structure of backside contact solar cells, therefore, is an effective way to improve UV stability of the solar cell, minimizing passivation level degradation over time.

Although amorphous silicon improves UV stability of backside contact solar cells, it creates one problem in that amorphous silicon has high absorption in the visible region of light. This means that amorphous silicon in a front side anti-reflection structure can reduce the efficiency of the solar cell. This phenomenon is explained with reference to FIG. 9.

Figure 9:
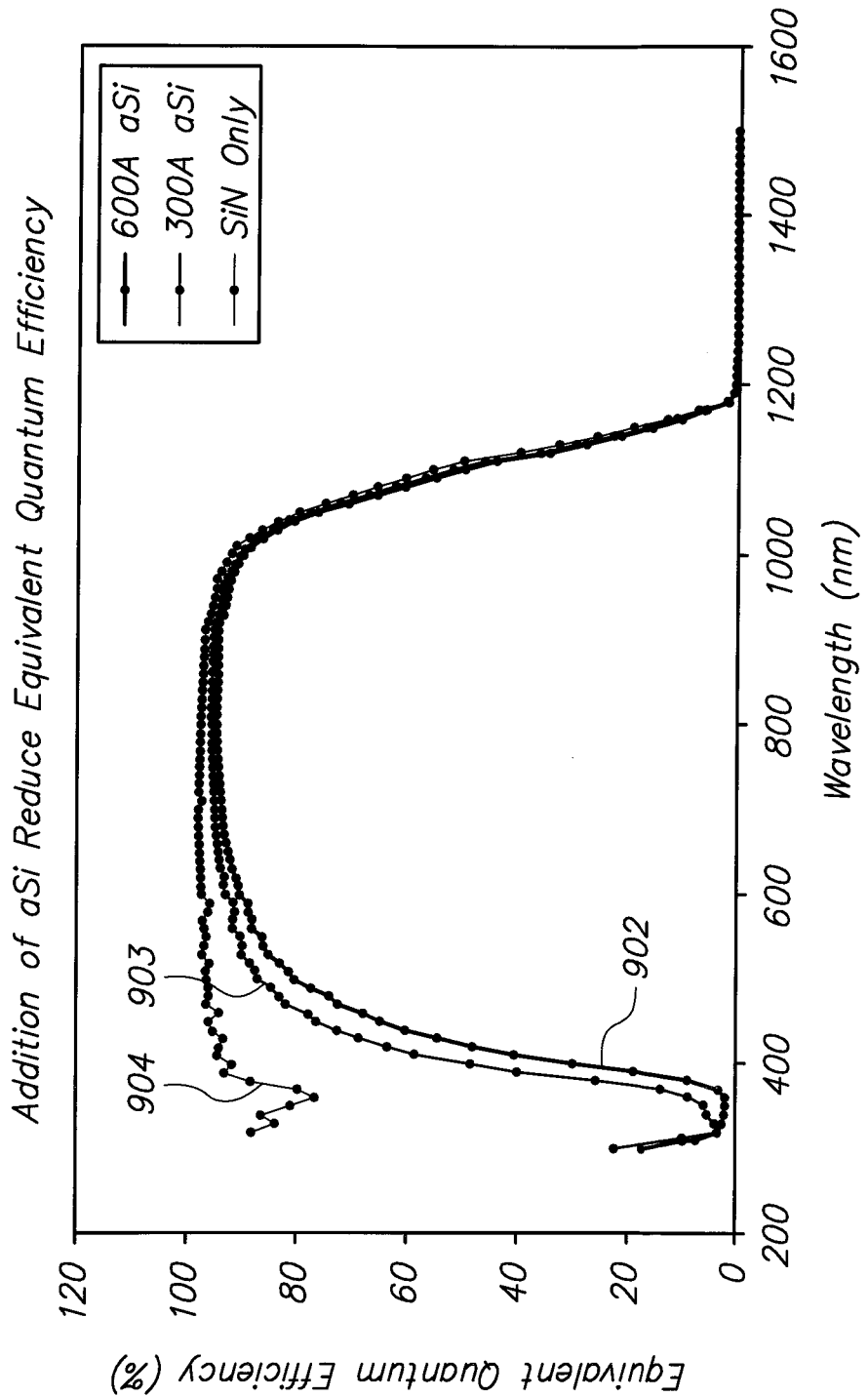
FIG. 9 shows plots of the effect of amorphous silicon on quantum efficiency.

FIG. 9 shows plots of the effect of amorphous silicon to quantum efficiency. In the context of solar cells, quantum efficiency is the percentage of photons hitting the solar cell surface that will generate electron-hole pairs. See also, S. M. Sze, Physics of Semiconductor Devices, $2^{nd}$ Ed. 1981. In the example of FIG. 9, the horizontal axis represent wavelength of light, while the vertical axis represents equivalent quantum efficiency in percent. The plot 902 is for a backside contact solar cell as in the solar cell 300A with a 100 nm thick silicon nitride layer 414 and 60 nm thick amorphous silicon layer 413, and the plot 903 is for a backside contact solar cell as in the solar cell 300A with a 100 nm thick silicon nitride layer 414 and 30 nm thick amorphous silicon layer 413. The plot 904 is for a backside contact solar cell with no amorphous silicon layer in its anti-reflection structure as in the solar cell 100 (see FIG. 1). Comparing plot 904 to plots 902 and 903, it is evident that addition of amorphous silicon to the front side of a backside contact solar cell reduces equivalent quantum efficiency. The thicker the amorphous silicon added, the larger the reduction in efficiency.

Figure 10:
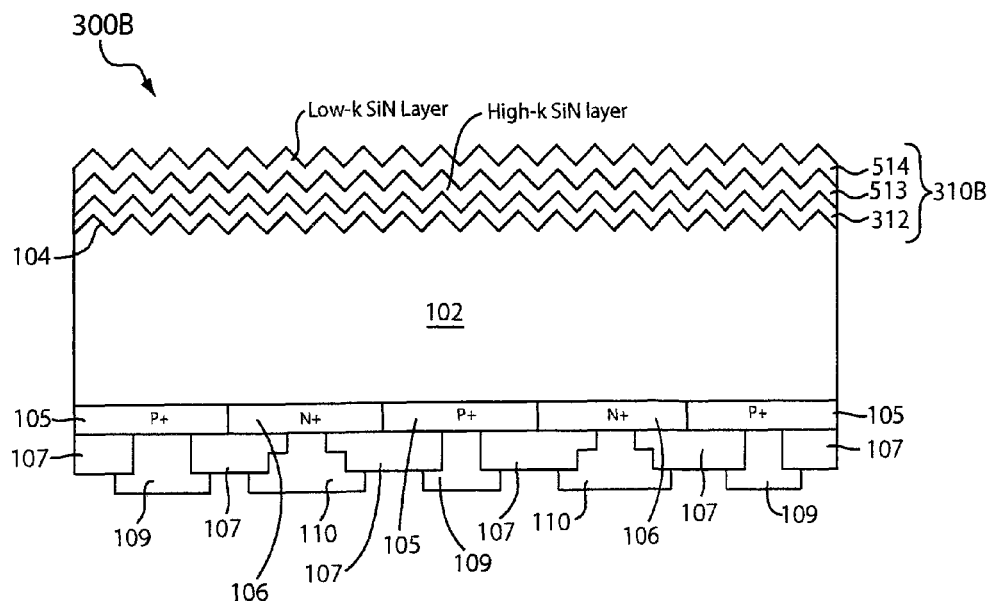
FIG. 10 shows a schematic diagram of a backside contact solar cell in accordance with an embodiment of the present invention.

Referring now to FIG. 10, there is shown a schematic diagram of a backside contact solar cell 300B in accordance with an embodiment of the present invention. The solar cell 300B is a particular embodiment of the solar cell 300 (see FIG. 3) where the high optical absorption layer comprises a high-k silicon nitride layer 513 and the low optical absorption layer comprises a low-k silicon nitride layer 514. The multi-layer anti-reflection structure of the solar cell 300B is collectively labeled as "310B." The solar cells 300B and 300A are otherwise the same.

"High-k silicon nitride" and "low-k silicon nitride" refer to silicon nitride with a high extinction coefficient and low extinction coefficient, respectively. A high-k silicon nitride comprises silicon nitride having an extinction coefficient of at least 0.03 at light wavelengths of 400 nm and shorter. In one embodiment, a high-k silicon nitride may be formed by plasma enhanced chemical vapor deposition or reactive sputtering. A low-k silicon nitride comprises silicon nitride having an extinction coefficient of at most 0.03 at light wavelengths of 400 nm and longer. In one embodiment, a low-k silicon nitride may be formed by plasma enhanced chemical vapor deposition or reactive sputtering.

Figure 11:
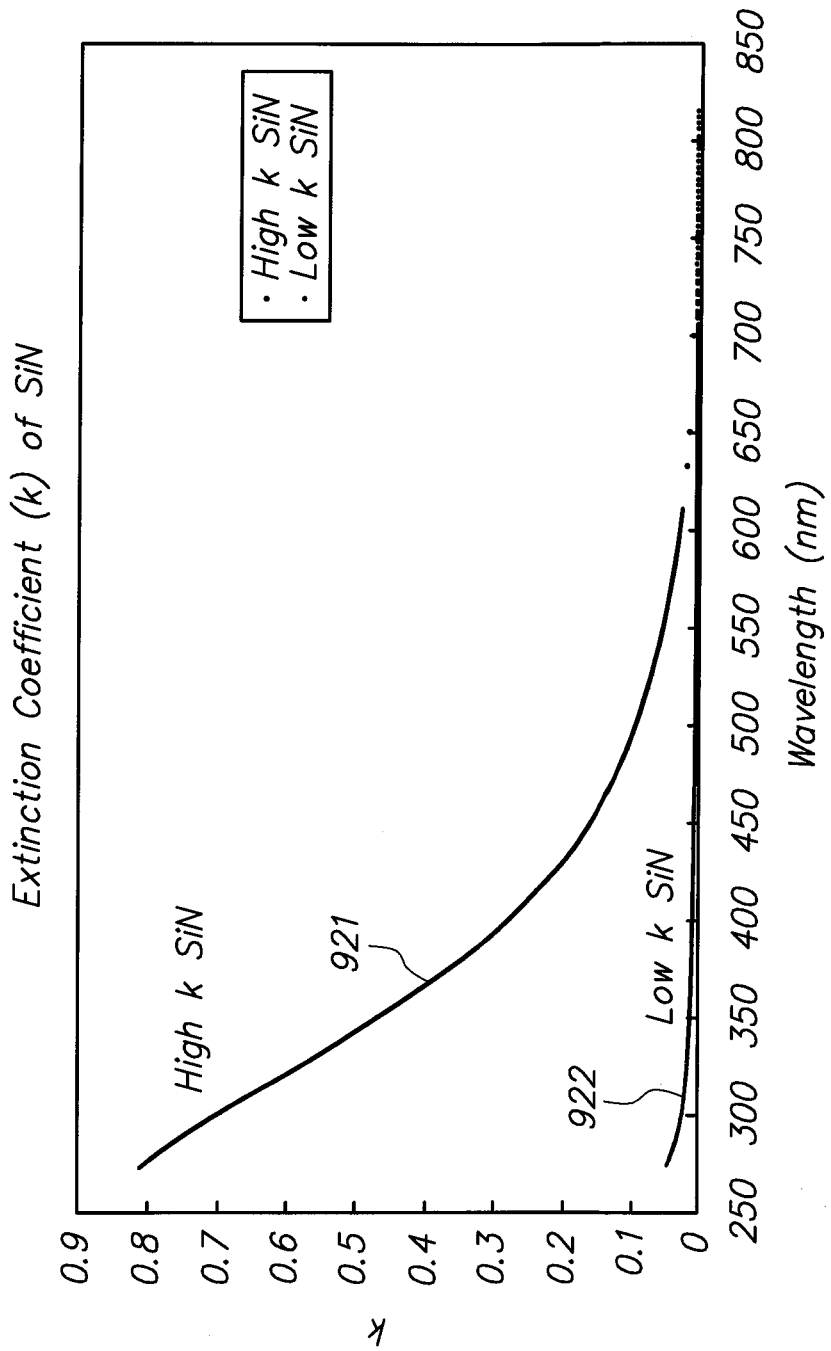
FIG. 11 shows plots of extinction coefficient as a function of light wavelength for high-k and low-k silicon nitride layers.

FIG. 11 shows plots of extinction coefficient as a function of light wavelength for high-k and low-k silicon nitride layers. In the example of FIG. 11, the horizontal axis represents wavelength of light and the vertical axis represents extinction coefficient. Plot 921 is for a high-k silicon nitride, while plot 922 is for a low-k silicon nitride. As is evident from FIG. 11, the extinction coefficient of high-k silicon nitride is orders of magnitude higher than that of low-k silicon nitride at wavelengths of 400 nm and shorter.

FIG. 12 shows a table of optical properties and the effect of low-k and high-k silicon nitrides on light intensity. From FIG. 12, the low-k silicon nitride is virtually transparent to UV radiation. High-k silicon nitride, on the other hand, has quite a lot of absorption (see α) in the UV range. At 400 nm, it takes a thickness of about 10 nm to take away 10% of the light with the high-k silicon nitride. At 350 nm, it takes only about 6 nm of thickness to do the same. High-k silicon nitride is therefore a very good UV radiation filter and can be used to improve UV stability of solar cells.

Besides being a good UV radiation filter, high-k silicon nitride is also relatively transparent in the visible range. This makes high-k silicon nitride preferable to amorphous silicon as a high optical absorption layer in a multilayer anti-reflection structure. From FIG. 12, it takes about 668 nm of high-k silicon nitride to take away 10% of light at the wavelength of 535 nm, while amorphous silicon only requires a thickness of 151 nm (see FIG. 7). High-k silicon nitride can thus be used as relatively good UV filter while still allowing most of the visible light to enter into the silicon substrate of the solar cell for conversion to electrical energy.

Preferably, the thickness of high-k silicon nitride in the anti-reflection structure is such that it would at least maintain solar cell efficiency while improving UV stability. The thickness of the high-k silicon nitride may vary depending on the particulars of the backside contact solar cell. In general, the thickness of the high-k silicon nitride may be determined in accordance with EQ. 1:

$$\text{High Optical Absorption Layer Thickness} > \ln(0.9)\lambda/(-4\pi k), \quad \text{(EQ. 1)}$$

where $\lambda$ is the wavelength of light and is 400 nm or less and $k$ is the extinction coefficient. Preferably, the high-k silicon nitride is configured to filter out at least 10% of UV radiation (wavelength of 400 nm or shorter) to which the solar cell is exposed. Note that EQ. 1 may be used to determine the thickness of high optical absorption layers in general, not just high-k silicon nitrides.

Figure 1:
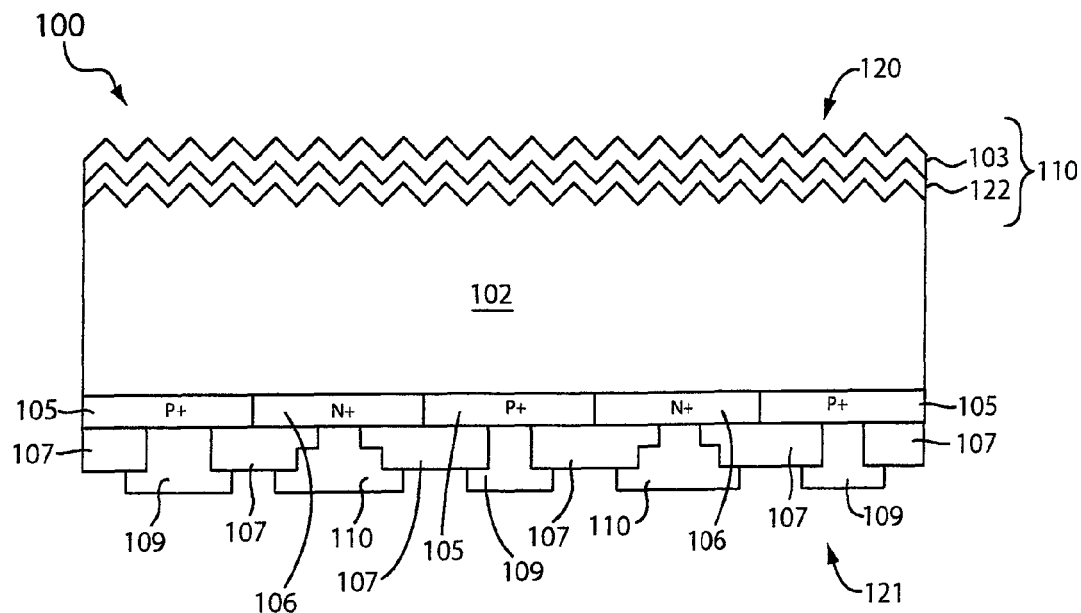
FIG. 1 schematically shows a conventional backside contact solar cell.
Figure 13:
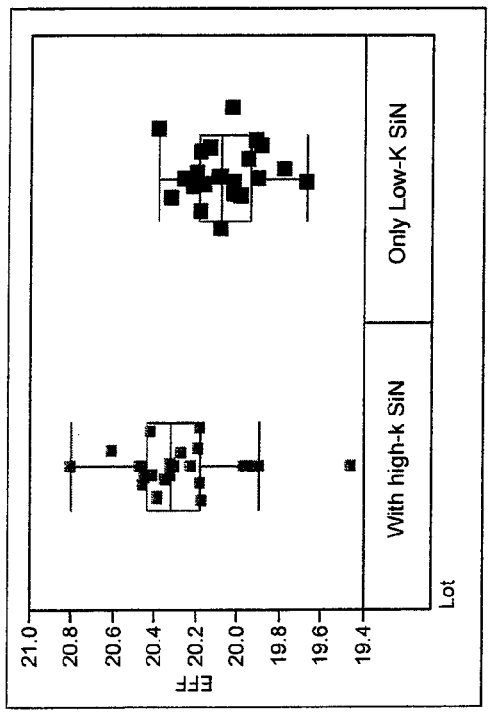
FIG. 13 shows experimental results illustrating the effect of using a high-k silicon nitride on efficiency of backside contact solar cells.

FIG. 13 shows experimental results illustrating the effect of using a high-k silicon nitride on overall efficiency of backside contact solar cells. In FIG. 13, the column labeled "With high-k SiN" is for backside contact solar cells with high-k silicon nitride as in the backside contact solar cell 300B (FIG. 10) and the column labeled "Only Low-K SiN" is for backside contact solar cells without a high-k silicon nitride as in the backside contact solar cell 100 (FIG. 1). As is evident from FIG. 13, the high-k silicon nitride has minimal effect on efficiency and even results in higher efficiency in some samples. Having a high-k silicon nitride on a multilayer anti-reflection structure does not detrimentally affect efficiency.

Figure 14:
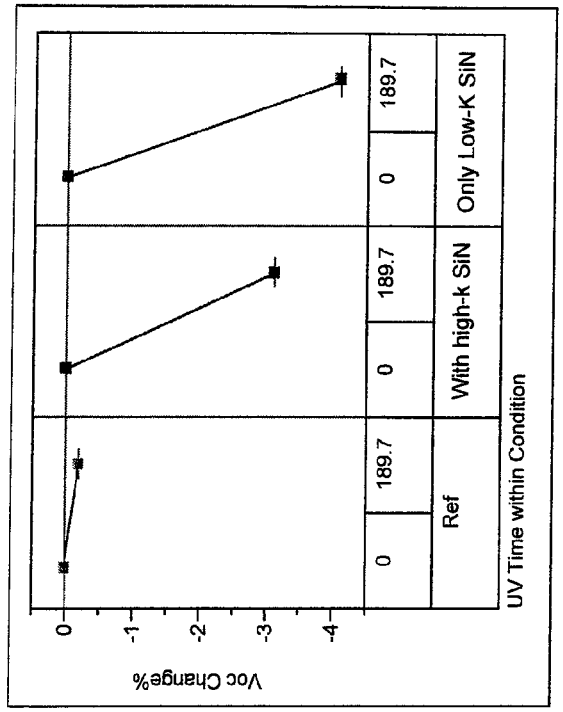
FIG. 14 shows experimental results illustrating the effect of using a high-k silicon nitride on UV reliability of backside contact solar cells.

FIG. 14 shows experimental results illustrating the effect of using a high-k silicon nitride on percent change of open circuit voltage of backside contact solar cells. In FIG. 14, the column labeled "With high-k SiN" is for backside contact solar cells with high-k silicon nitride as in the backside contact solar cell 300B (FIG. 10) and the column labeled "Only Low-K SiN" is for backside contact solar cells without a high-k silicon nitride as in the backside contact solar cell 100 (FIG. 1). The column labeled "Ref" is for reference only and is for backside contact solar cells 100 that were not exposed to UV radiation. The columns indicate the amount of time, in hours (zero and 189.7 hours), the solar cells were exposed under UV radiation. From FIG. 14, it can be seen that having a high-k silicon nitride on a multilayer anti-reflection structure stabilizes the solar cell by minimizing degradation of open circuit voltage due to UV exposure. Use of high-k silicon nitride thus improves UV stability of backside contact solar cells without detrimentally affecting efficiency.

Figure 15:
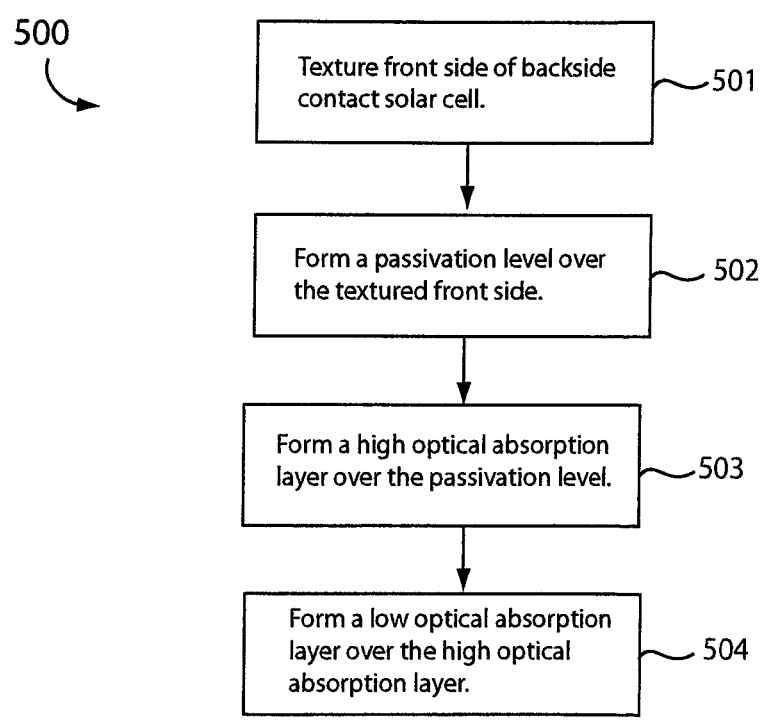
FIG. 15 shows a flow diagram of a method of forming a multilayer anti-reflection structure on a backside contact solar cell in accordance with an embodiment of the present invention.

Referring to FIG. 15, there is shown a flow diagram of a method 500 of forming a multilayer anti-reflection structure on a backside contact solar cell in accordance with an embodiment of the present invention. The backside contact solar cell includes a front side facing the sun during normal operation and a backside opposite the front side. Diffusion regions and metal contacts for contacting them are all formed on the backside of the solar cell.

In step 501, the front side of the solar cell is randomly textured. Random texturing may be formed on the front side surface of the N-type silicon substrate. The front side surface of the substrate may be textured using a wet etch process comprising potassium hydroxide, water, and isopropyl alcohol, for example. The wet etch process textures the front side with random pyramids, thereby advantageously improving solar radiation collection efficiency.

In step 502, a passivation level is formed over the textured front side surface. In one embodiment, the passivation level comprises a layer of silicon dioxide thermally grown on the textured front side surface to a thickness of about 0.5 nm to 100 nm, preferably to a thickness of about 50 nm.

In step 503, a high optical absorption layer configured to block UV radiation is formed on the passivation level. Preferably, the high optical absorption layer is configured to block at least 10% of light in the wavelengths of 400 nm and shorter coming into the silicon substrate from the front side. The thickness of the high optical absorption layer may vary depending on the application. EQ. 1 discussed above for high-k silicon nitride may be used to calculate the thickness of the high optical absorption layer for other materials as well. The high optical absorption layer may comprise high-k silicon nitride formed to a thickness of about 1 nm to 100 nm, preferably to a thickness of about 12 nm, by plasma enhanced chemical vapor deposition or reactive sputtering.

In step 504, a low optical absorption layer is formed over the high optical absorption layer. The low optical absorption layer may comprise low-k silicon nitride deposited to a thickness of 20 nm to 100 nm, preferably to a thickness of about 60 nm, by plasma enhanced chemical vapor deposition, reactive sputtering or other suitable process.

An improved multilayer anti-reflection structure for backside contact solar cells and process for making same have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A backside contact solar cell comprising:
    a textured surface on a front side of a silicon substrate of the backside contact solar cell, the front side facing the sun during normal operation to collect solar radiation;
    a passivation layer formed over and in direct contact with the textured surface;
    a high optical absorption layer formed over and in direct contact with the passivation layer, wherein the high optical absorption layer is a high-k silicon nitride layer having an extinction coefficient of at least 0.03 to light at wavelengths of 400 nm and shorter; and
    a low optical absorption layer formed over and in direct contact with the high optical absorption layer, wherein the low optical absorption layer is a low-k silicon nitride layer having an extinction coefficient of at most 0.03 to light at wavelengths of 400 nm and longer.

2. The backside contact solar cell of claim 1, wherein the passivation layer comprises silicon dioxide.

3. The backside contact solar cell of claim 1, wherein the high optical absorption layer is configured to block 10% of UV radiation coming into the silicon substrate from the front side.

4. The backside contact solar cell of claim 1, wherein the high optical absorption layer is transparent in visible range.

5. The backside contact solar cell of claim 1, wherein the low optical absorption layer is transparent to UV radiation.

* * * * *